United States Patent
Lin

(10) Patent No.: US 9,178,510 B2
(45) Date of Patent: Nov. 3, 2015

(54) METHODS AND TOUCH DEVICES USING MULTIPLE SAMPLING FREQUENCIES

(75) Inventor: Yung-Sen Lin, New Taipei (TW)

(73) Assignee: Acer Incorporated, New Taipei (TW)

( * ) Notice: Subject to any disclaimer, the term of this patent is extended or adjusted under 35 U.S.C. 154(b) by 289 days.

(21) Appl. No.: 13/225,619

(22) Filed: Sep. 6, 2011

(65) Prior Publication Data
US 2013/0021267 A1    Jan. 24, 2013

(30) Foreign Application Priority Data
Jul. 18, 2011 (TW) .............................. 100125260 A

(51) Int. Cl.
*H03K 17/96* (2006.01)
*G06F 3/041* (2006.01)
*G06F 3/044* (2006.01)

(52) U.S. Cl.
CPC ............ *H03K 17/9622* (2013.01); *G06F 3/044* (2013.01); *G06F 3/0416* (2013.01); *H03K 2217/960705* (2013.01)

(58) Field of Classification Search
CPC ... G06F 3/0416; G06F 3/044; H03K 17/9622; H03K 2217/960705
USPC ........................... 345/173–178; 256/173–178
See application file for complete search history.

(56) References Cited

U.S. PATENT DOCUMENTS

| | | | | |
|---|---|---|---|---|
| 6,124,848 A | | 9/2000 | Ballare et al. | |
| 6,278,445 B1 | * | 8/2001 | Tanaka et al. | 345/178 |
| 7,852,325 B2 | * | 12/2010 | Fu et al. | 345/174 |
| 2005/0212779 A1 | * | 9/2005 | Burns | 345/176 |
| 2008/0157893 A1 | * | 7/2008 | Krah | 331/177 R |
| 2008/0309625 A1 | * | 12/2008 | Krah et al. | 345/173 |
| 2011/0254807 A1 | * | 10/2011 | Perski et al. | 345/174 |
| 2012/0001859 A1 | * | 1/2012 | Kim et al. | 345/173 |
| 2013/0162585 A1 | * | 6/2013 | Schwartz | 345/174 |

FOREIGN PATENT DOCUMENTS

EP     0818751 A1     1/1998

OTHER PUBLICATIONS

European Search Report, EP12163758, Jul. 30, 2012, 6 pages.

* cited by examiner

*Primary Examiner* — Christopher E Leiby
(74) *Attorney, Agent, or Firm* — Edell, Shapiro & Finnan, LLC

(57) ABSTRACT

Techniques for using multiple sampling frequencies to detect the location of touch inputs of a user at a touch panel of a touch device. A determination is made as to which of and second sampling frequencies is provided to a receiver for use in sampling the touch inputs from the touch panel. The user touch inputs are first sampled from the touch panel during first and second successive time frames using first and second different sampling frequencies, respectively.

14 Claims, 8 Drawing Sheets

METHODS AND TOUCH DEVICES USING MULTIPLE SAMPLING FREQUENCIES

TECHNICAL FIELD

The present disclosure relates generally to touch devices.

BACKGROUND

Touch sensors or touch panels have become a popular type of user interface and are used in many types of devices, such as mobile phones, personal digital assistants (PDAs), navigation devices, video games, computers, etc., collectively referred to herein as touch devices. Touch devices recognize a touch input of a user and obtain the location of the touch to effect a selected operation.

A touch panel may be positioned in front of a display screen such as a liquid crystal display (LCD), or may be integrated with a display screen. Such configurations, referred to as touch screens, allow the user to intuitively connect a pressure point of the touch panel with a corresponding point on the display screen, thereby creating an active connection with the screen.

SUMMARY

Described herein are methodologies for detecting the location of touch inputs of a user at a touch device. In one embodiment, a determination is made as to which of first and second sampling frequencies is provided to a receiver for use in sampling touch inputs of a user from a touch panel of the touch device. The touch inputs are sampled from the touch panel during first and second successive time frames using first and second different sampling frequencies, respectively.

Another embodiment is directed to a touch device configured to detect the location of touch inputs of a user at a touch panel through the use of multiple sampling frequencies. The touch device may include a touch panel configured to sample a touch input of a user, and a control circuit comprising a driver, a receiver, a sampling frequency generation circuit, and a microcontroller (MCU). The receiver is configured to sample touch inputs from the touch panel and the sampling frequency generation circuit is connected to the receiver and is configured to generate first and second sampling frequencies in first and second successive time frames. The MCU is configured to determine which of the first and second sampling frequencies is provided to the receiver for use in sampling the touch inputs.

BRIEF DESCRIPTION OF THE DRAWINGS

Embodiments are described herein in conjunction with the accompanying drawings, in which.

DESCRIPTION OF EXAMPLE EMBODIMENTS

Figure 1:
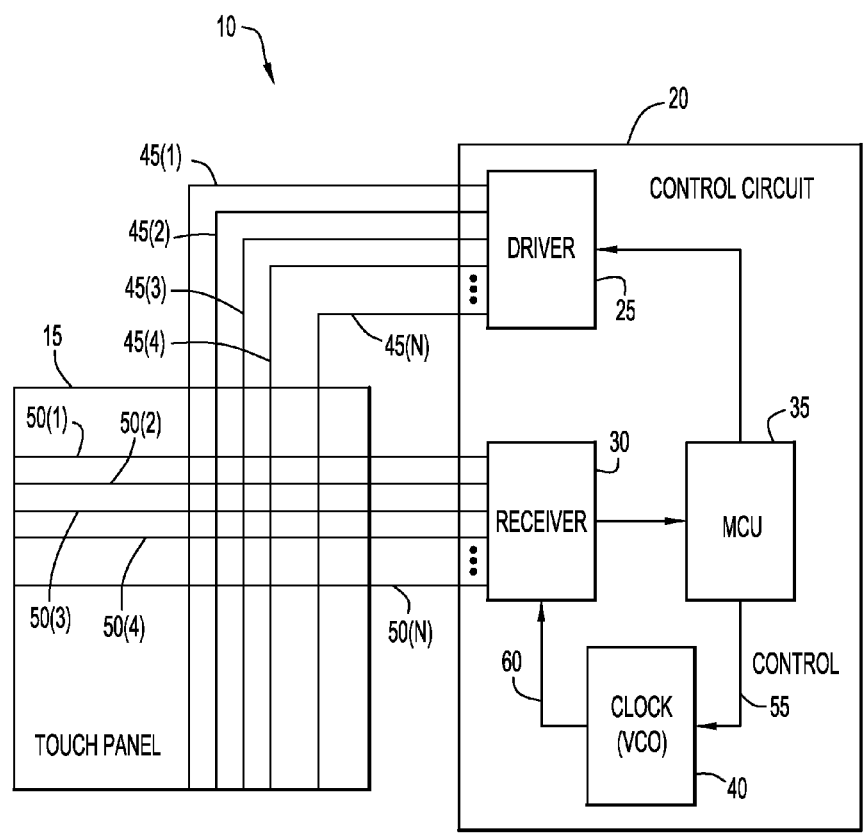
FIG. 1 is a block diagram of a prior art touch device.

FIG. 1 is a block diagram of a prior art touch device 10 comprising a capacitive touch panel 15 and a control circuit 20. Control circuit 20 may include a driver 25, a receiver 30, a microcontroller (MCU) 35, and a clock 40.

Driver 25 is connected to a plurality of drive signal lines 45(1)-45(N), while receiver 30 is connected to a plurality of sense signal lines 50(1)-50(N). As is well known in the art, drive signal lines 45(1)-45(N) and sense signal lines 50(1)-50(N) are connected to drive and sense electrodes (not shown) in touch panel 15 to form a matrix of electrode pairs (overlapping drive and sense electrodes) that are used to sense the location (X and Y coordinates) of a user touch input (a user's touch). In operation, driver 25 provides voltage pulses to the drive electrodes, thereby resulting in an electric field between the drive electrodes and the sense electrodes. The sense electrodes receive or sink the generated electric field via a coupling capacitance, which results in a current signal. Sense signal lines 50(1)-50(N) conduct this current signal to receiver 30.

If a user touches touch panel 15, the coupling between pairs of one or more electrodes will increase at the location of the touch. Receiver 30 detects this increase in the coupling (via changes in the received current), and MCU 35 can use this information to determine the X and Y location of the user touch input.

As is known in the art, receiver 30 is not configured to continuously detect increases in the coupling between all electrode pairs, but rather the receiver 30 samples the capacitive couplings in a predetermined pattern in accordance with a predetermined sampling frequency. This sampling frequency is controlled by MCU 35 via clock 40 which may be, in practice, a voltage controllable oscillator (VCO). In other words, based on one or more control signals 55 received from MCU 35, a sampling frequency 60 is generated by VCO 40 for use by receiver 30 in receiving data representing the coupling between electrode pairs.

In certain circumstances, noise may interfere with the sampling frequency, thereby degrading the ability of touch device 10 to accurately determine the position of user touch inputs. If noise is detected, control circuit 20 can be configured to change the sampling frequency generated by VCO 40 to a different frequency that is not interfered with by the noise. However, during the period of time to effect the sampling frequency change, receiver 30 may not accurately obtain touch information. This period of time in which user touch inputs are not accurately sampled may make the touch panel feel unresponsive to the user. Moreover, it may take several attempts to obtain a different frequency that is not interfered with by the noise, and each attempt extends the time period during which accurate touch input detection may be degraded.

Figure 2:
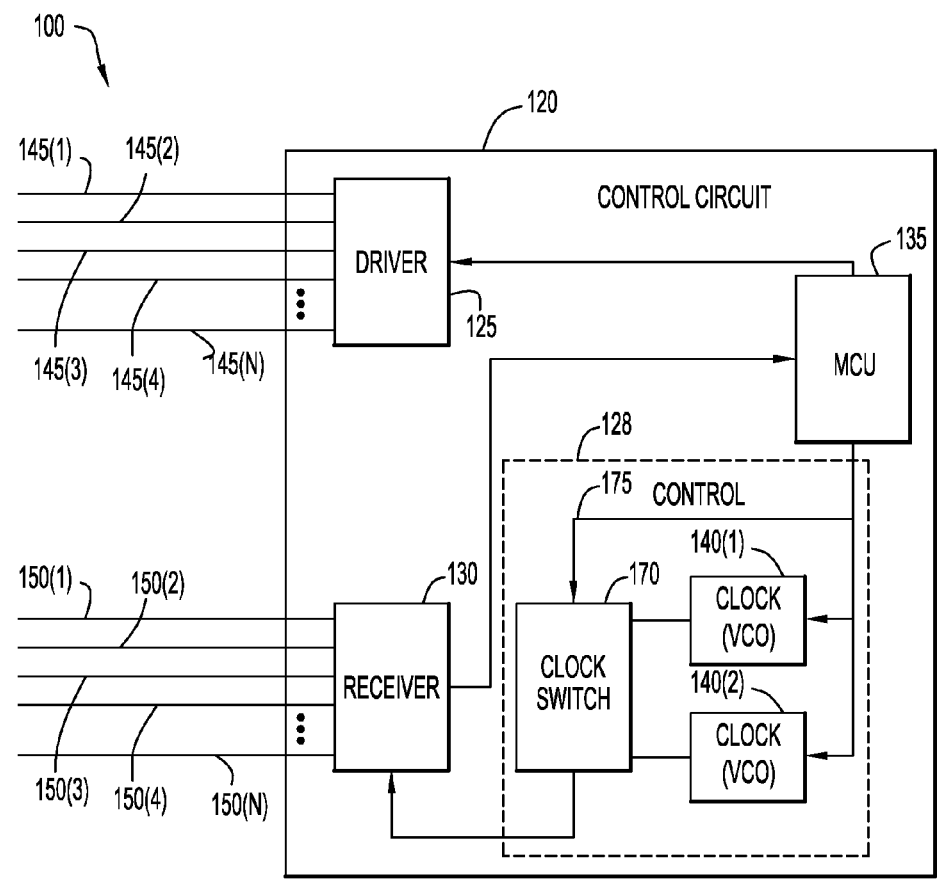
FIG. 2 is a block diagram of a touch device configured to use multiple sampling frequencies to sample user touch inputs at a touch panel.

FIG. 2 is a block diagram of a touch device 100 configured to use multiple sampling frequencies to sample user touch inputs at a touch panel according to a first embodiment of the present disclosure. Touch device 100 may include a control circuit 120 and a capacitive touch panel (not shown in FIG. 2). The touch panel of device 100 may be substantially similar to capacitive touch panel 15 of FIG. 1 and may be, for example, positioned in front of a display screen such as a liquid crystal display (LCD), or integrated with a display screen. Control circuit 120 comprises a driver 125, a sampling frequency generation circuit 128, a receiver 130, and a microcontroller (MCU) 135. Sampling frequency generation circuit 128 comprises first and second clocks 140(1) and 140(2), and a clock switch 170. First and second clocks 140(1) and 140(2) may each be independent voltage controllable oscillators (VCOs).

Similar to the arrangement of FIG. 1, driver 125 is connected to a plurality of drive electrodes (not shown in FIG. 2) in the touch panel via drive signal lines 145(1)-145(N), while receiver 30 is connected to a plurality of sense electrodes (also not shown in FIG. 2) in the touch panel via signal lines 150(1)-150(N). As noted above, the drive and sense electrodes form a matrix of electrode pairs that are used to sense the location of user touch inputs. In operation, driver 125 provides voltage pulses to the drive electrodes, thereby resulting in an electric field between the drive electrodes and sense electrodes. The sense electrode sinks the generated electric field via a coupling capacitance, which results in a current signal. Sense signal lines 150(1)-150(N) conduct this current signal to receiver 130. If a user touches the touch panel, the capacitive coupling between pairs of one or more electrodes will increase at the location of the touch. Receiver 130 detects this increase in the coupling (via changes in the received current), and MCU 135 can use this information to determine the X and Y location of the user touch input.

Receiver 130 is not configured to continuously detect increases in the coupling between all electrode pairs. Rather, in the example of FIG. 2, the capacitive couplings are sampled in a predetermined pattern using multiple sampling frequencies. A first such sampling frequency ($f_1$) is generated by VCO 140(1), while a second sampling frequency ($f_2$) is generated by VCO 140(2). Each generated frequency may be used by receiver 130 to detect user touch inputs at the touch panel. However, in operation, receiver 130 alternates between the frequencies $f_1$ and $f_2$ during the sampling process.

More specifically, the sampling process is divided into successive first and second time frames. During the first (odd) time frames (e.g., frames 1, 3, 5, 7, etc.), the first sampling frequency ($f_1$) generated by VCO 140(1) is used by receiver 130 to sample touch inputs at the touch panel, while during the second (even) time frames (e.g., frames 2, 4, 6, 8, etc.), the second sampling frequency ($f_2$) generated by VCO 140(2) is used by receiver 130 to sample touch inputs at the touch panel. Under the control of MCU 135, clock switch 170 controls which sampling frequency (i.e., which VCO output) is used in a given time frame.

Figure 3:
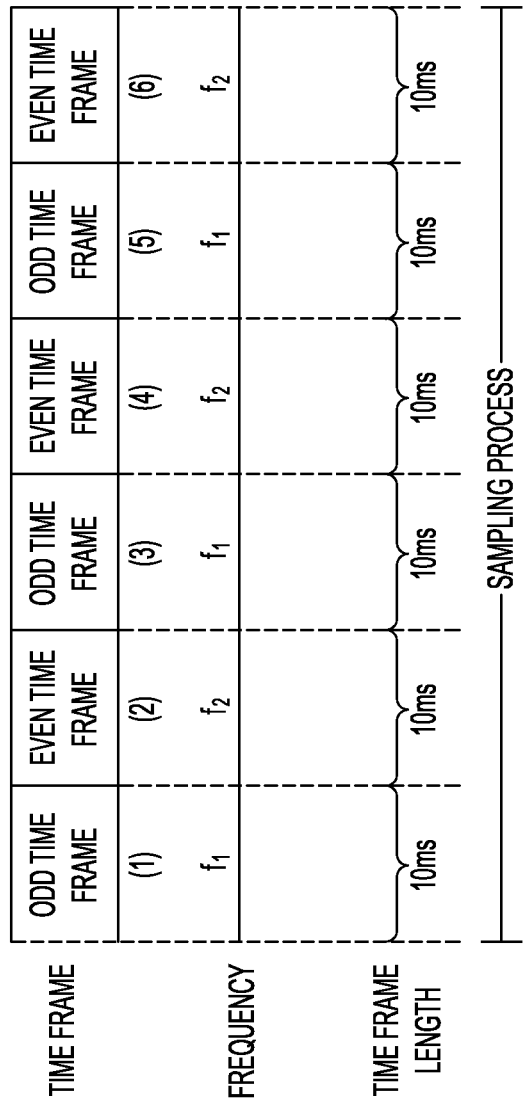
FIG. 3 is a schematic diagram illustrating first and second time frames in which first and second sampling frequencies, respectively, are used to sample user touch inputs at a touch panel.

FIG. 3 is a schematic diagram illustrating the successive first (odd) and second (even) time frames. During the odd time frames, the first sampling frequency $f_1$ is used to sample the touch inputs, while during the even time frames, the second sampling frequency $f_2$ is used to sample touch inputs. The first and second sampling frequencies $f_1$ and $f_2$ may be in the range of one to several thousand kHz or one or several hundred MHz. For example, $f_1$ may be approximately 50 MHz, while $f_2$ may be approximately 100 MHz. It should be appreciated that these values for $f_1$ and $f_2$ are merely illustrative and that other sampling frequencies may be used.

As shown in FIG. 3, the first and second time frames each have a time length of approximately 10 ms. This provides a frame rate (i.e., the rate at which receiver 130 alternates between the first and second sampling frequencies to sample touch inputs) of approximately 100 Hz. It should be appreciated that this frame rate is merely illustrative and other time lengths for the first and second time frames may be used.

Returning to the example of FIG. 2, MCU 135 controls the frame rate via clock switch 170. Clock switch 170 is electrically connected between receiver 130 and each of VCO 140(1) and VCO 140(2). More specifically, MCU 135 sends one or more control signals 175 to clock switch 170 that cause the clock switch to alternatively connect one of VCO 140(1) or VCO 140(2) to receiver 130. When a VCO is connected to receiver 130 (via clock switch 170), the receiver will use the sampling frequency generated by that VCO to sample the touch panel.

Figure 4A:
FIGS. 4A-4C are graphs schematically illustrating the changing of a first sampling frequency to a third sampling frequency in response to the detection of noise.
Figure 4B:
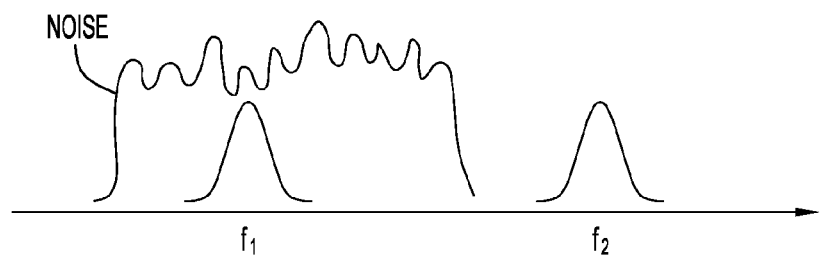

FIG. 4A is a graph schematically illustrating the first ($f_1$) and second ($f_2$) sampling frequencies generated by VCOs 140(1) and 140(2), respectively. As shown in FIG. 4B, in certain circumstances noise may interfere with, for example, $f_1$, thereby degrading the ability of touch device 100 to accurately determine the position of user touch inputs received during the first time period.

Figure 4C:
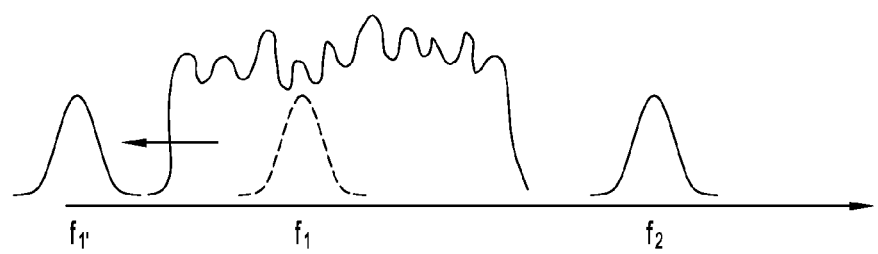

In the example of FIG. 2, if it is determined that noise interferes with $f_1$, MCU 135 will adjust or change $f_1$ to a first candidate frequency ($f_1'$) that is not interfered with by the noise. This adjustment is schematically shown in FIG. 4C. More specifically, MCU 135 may detect noise that interferes with $f_1$ by monitoring the signal-to-noise ratio (SNR) of the signals received during the first time frame. If sufficient noise is detected, MCU 135 provides one or more control signals to VCO 140(1) to adjust $f_1$ to the new sampling frequency, $f_1'$.

Once the first candidate frequency $f_1'$ is obtained, this sampling frequency is used during the first time period in place of the first sampling frequency. That is, clock switch 170 continues to alternately connect VCO 140(1) and 140(2) to receiver 130 in successive time frames, but, because VCO 140(1) is generating the first candidate frequency $f_1'$, this new sampling frequency is used during the first time period (i.e., the period in which VCO 140(1) is connected to receiver 130 via clock switch 170).

When MCU 135 detects noise that interferes with $f_1$ and performs the adjustment of $f_1$ to $f_1'$, receiver 130 continues to sample touch inputs, but uses only $f_2$. In one such example, MCU 135 instructs clock switch 170 to remain connected between VCO 140(2) and receiver 130 during the adjustment of $f_1$ to the first candidate frequency $f_1'$, thereby preventing the use of the VCO 140(1) during the frequency adjustment. Because the adjustment may not be instantaneous, $f_2$ may be used for multiple time frames, thus effectively temporarily extending the length of the second time frame until the adjustment of $f_1$ to the new frequency is completed. In another example, when MCU 135 detects noise in a first time frame, the MCU is configured to complete the change of $f_1$ to the first candidate $f_1'$ during the subsequent second frame. As such, no first time frames are omitted and the frame rate and frame length are not affected.

As noted above, if noise is detected by the prior art touch device, the touch device will be unresponsive to user inputs until a new sampling frequency is set. However, in accordance with the techniques described herein, because sampling of touch inputs continues using $f_2$ during the change of $f_1$ to $f_1'$, delays resulting from the detection of noise may be eliminated. As such, the touch panel will generally be continually responsive to user inputs, and the noise will not affect operation of the device.

In certain circumstances, when the MCU 135 changes $f_1$ to the first candidate frequency $f_1'$, the MCU is configured to ensure that $f_1'$ is also not affected by any noise. As such, the MCU 135 may iteratively adjust the first sampling frequency by a predetermined amount (e.g., 100 kHz, 1 MHz, 5 MHz, 10

MHz, etc.) and, at each iteration, determine if noise interferes with the adjusted frequency. This iterative frequency adjustment continues until interference is no longer detected such that the first candidate frequency $f_1'$ can be set.

Additionally, the cause of the noise that interferes with $f_1$ may be only temporary. As such, after a period of time, the first candidate frequency $f_1'$ of VCO 140(1) may be changed back to $f_1$.

The examples of FIGS. 2-4 have been described with reference to changing $f_1$ in response to detected noise. It should be appreciated that noise may be additionally or alternatively detected that interferes with $f_2$ used in the second time frame. As such, $f_2$ generated by VCO 140(2) may be changed in substantially the same manner as described above with reference to $f_1$. That is, $f_2$ may be changed to a second candidate frequency $f_2'$ that is not interfered with by the noise.

Figure 5:
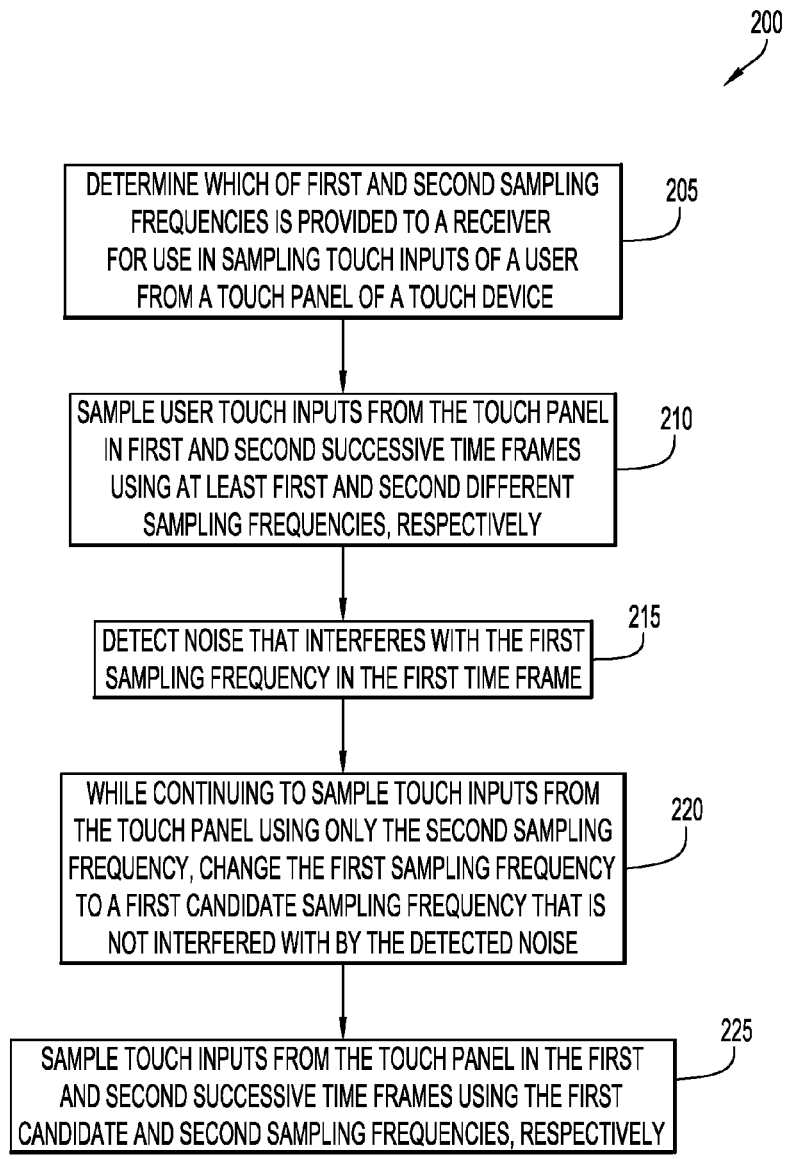
FIG. 5 is a flowchart illustrating a method implemented by a touch device using multiple sampling frequencies to sample user touch inputs at a touch panel.

FIG. 5 is a flowchart illustrating a method 200 implemented by a touch device for sampling touch inputs from a touch panel using multiple sampling frequencies. Method 200 begins at step 205 where a determination is made as to which of first and second sampling frequencies is provided to a receiver for use in sampling touch inputs of a user from the touch panel of the touch device. At step 210, user touch inputs are sampled from the touch panel during first and second successive time frames using first and second different sampling frequencies, respectively. At step 215, the touch device detects noise that interferes with the first sampling frequency used in the first time frame. At step 220, while the touch device continues to sample touch inputs from the touch panel using only the second sampling frequency, the first sampling frequency is changed to a first candidate sampling frequency that is not interfered with by the detected noise. At step 225, the touch device samples touch inputs from the touch panel in the first and second successive time frames using the first candidate and second sampling frequencies, respectively.

Figure 6:
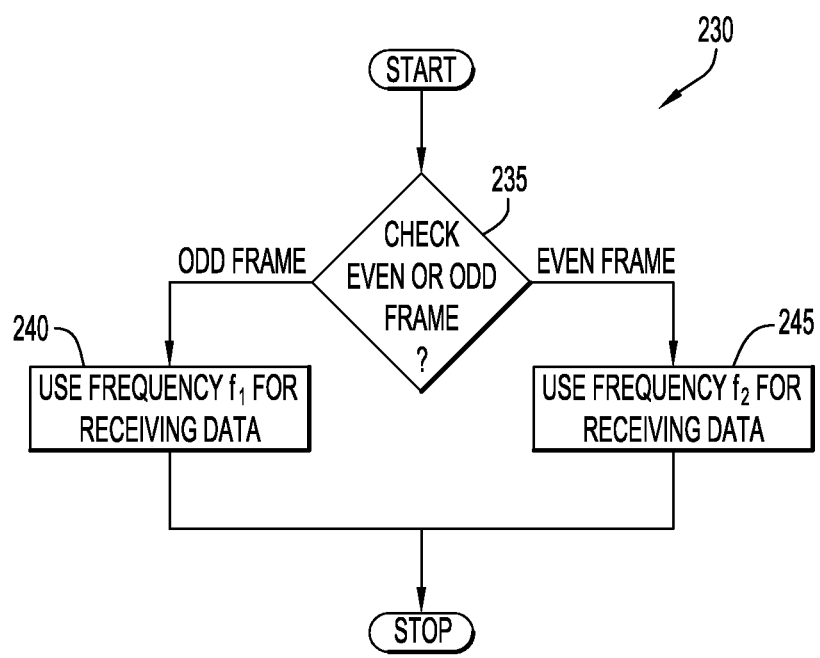
FIG. 6 is a flowchart illustrating operations performed by a touch device using multiple sampling frequencies to sample user touch inputs at a touch panel.

FIG. 6 is a flowchart illustrating an operational method 230 implemented by a touch device, such as device 100 of FIG. 2, during sampling operations. More specifically, method 230 begins at step 235 where MCU 135 performs a check to determine if the device is in an odd sampling frame (first time frame) or an even sampling frame (second time frame). If the device is in an odd time frame, the method proceeds to step 240 where data (touch inputs) are received using the first frequency. However, if the device is in an even time frame, the method proceeds to step 245 where data (touch inputs) are received using the second frequency. The process remains at step 240 or step 245 for the length of the applicable time frame, and then, after the expiration of the time frame, method 230 ends. This method may be repeated for each successive time frame.

Figure 7:
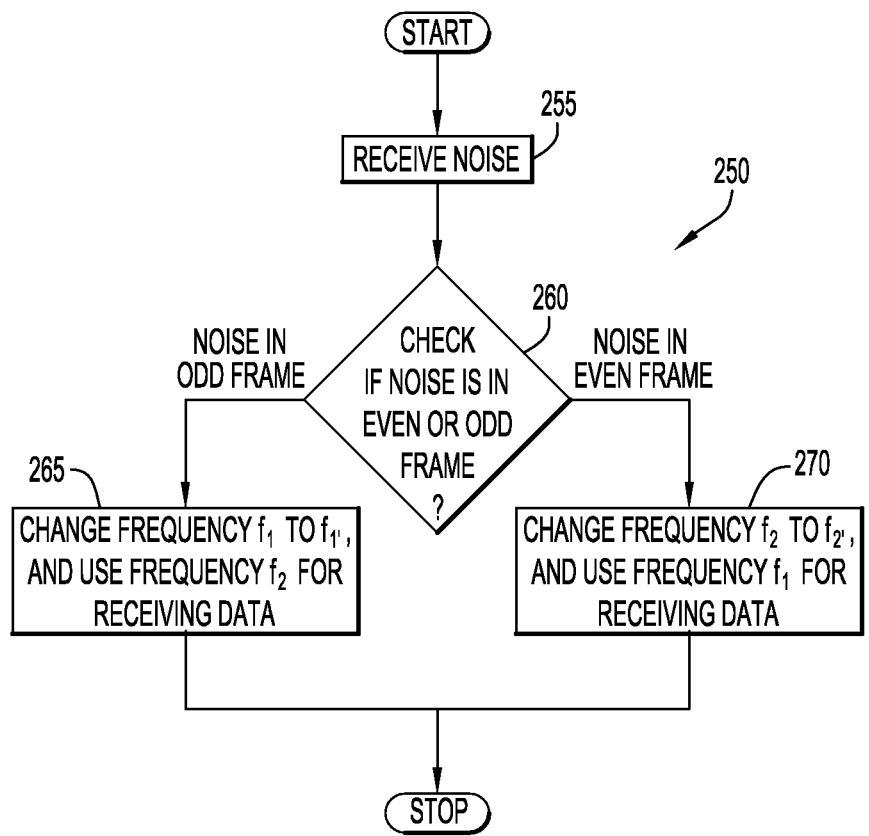
FIG. 7 is a flowchart illustrating additional operations performed by a touch device using multiple sampling frequencies to sample user touch inputs at a touch panel.

FIG. 7 is a flowchart illustrating another operational method 250. At step 255, noise is detected by MCU 135. At step 260, a check is performed to determine if the noise is in an even frame (interfering with $f_2$) or is in an odd frame (interfering with $f_1$). If the noise is in an odd time frame, the method proceeds to step 265 where, while $f_2$ is used to receive data, $f_1$ is changed to a first candidate frequency $f_1'$ for subsequent use in receiving data. If noise is in an even time frame, the method proceeds to step 270 where, while $f_1$ is used to receive data, $f_2$ is changed to a second candidate frequency $f_2'$ for use in receiving data. After $f_1$ or $f_2$ is changed, method 250 ends.

Figure 8:
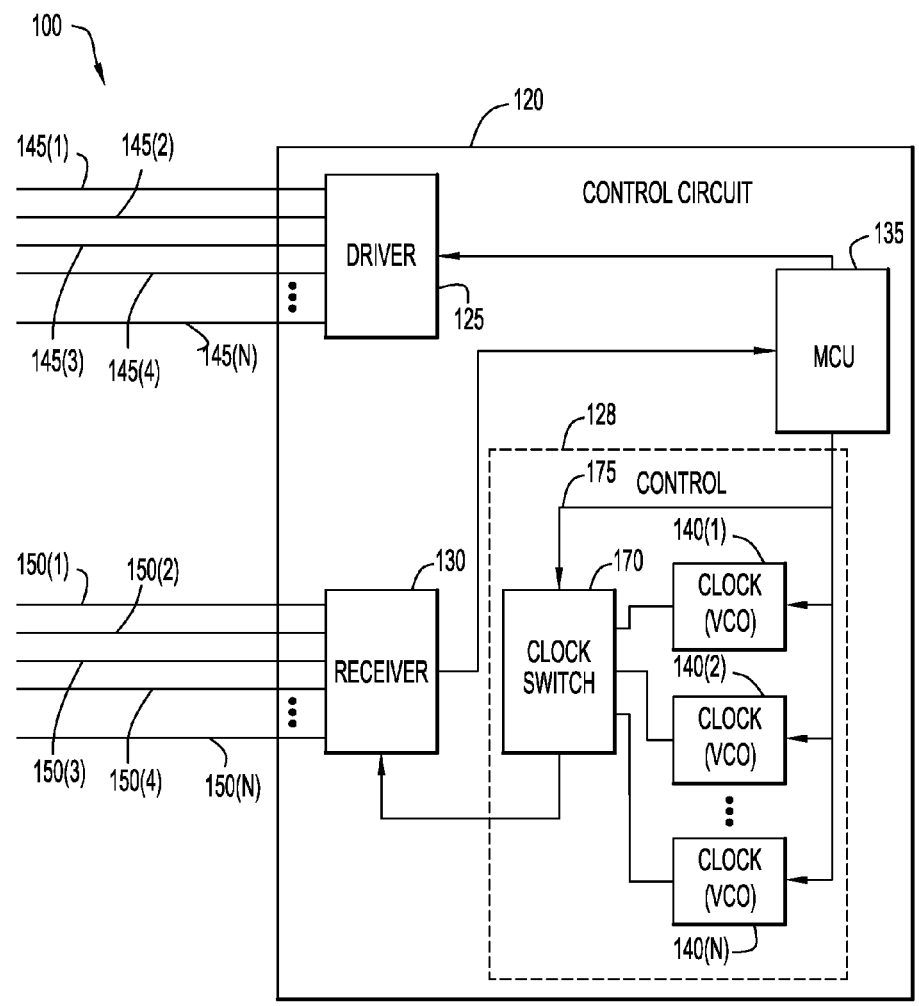
FIG. 8 is a block diagram of an alternative touch device configured to use multiple sampling frequencies to sample user touch inputs at a touch panel.

Examples have been described above with reference to the use of two sampling frequencies to sample user touch inputs at a touch panel. FIG. 8 illustrates an alternative arrangement for touch device 100 where more than two sampling frequencies (and time frames) may be used. Similar to the example of FIG. 2, device 100 comprises a control circuit 120 and a capacitive touch panel (not shown in FIG. 8). As noted above with reference to FIG. 2, control circuit 120 comprises a driver 125, a sampling frequency generation circuit 128, a receiver 130, and a microcontroller (MCU) 135. Sampling frequency generation circuit 128 comprises a clock switch 170 and, in contrast to the example of FIG. 2 in which sampling frequency generation circuit 128 includes only first and second clocks 140(1) and 140(2), sampling frequency generation 128 in FIG. 8 comprises one or more additional clocks. More specifically, sampling frequency generation circuit 128 includes a number (N) of clocks, where N is greater than 2.

In operation, each of the clocks 140(1)-140(N) generate a sampling frequency for use by receiver 130 to sample data (user touches) from the touch panel. In this arrangement, the sampling period may be divided into N time frames, with a different frequency used during each time frame. If noise is detected in any of the N time frames, the sampling frequency used therein may be changed as described above.

The above description is intended by way of example only.

What is claimed is:

1. A method comprising:
   at a touch panel comprising a matrix of overlapping drive signal lines and sense signal lines, driving the drive signal lines with voltage pulses configured to generate current signals at one or more of the sense signal lines in response to a touch input of a user at a point where the one or more sense signal lines overlap with one or more drive signal lines;
   determining first and second sampling frequencies for use by a receiver in sampling current signals at the plurality of sense signal lines, wherein the second sampling frequency is different from the first sampling frequency;
   sampling current signals at the sense signal lines in alternating first and second successive time frames, wherein only the first sampling frequency is used to sample the current signals at the sense signal lines during each of the first time frames and only the second sampling frequency is used to sample the current signals at the sense signal lines during each of the second time frames;
   detecting noise that interferes with the first sampling frequency used in each of the first time frames;
   while continuing to sample current signals at the sense signal lines using only the second sampling frequency, changing the first sampling frequency to a first candidate sampling frequency that is not interfered with by the detected noise; and
   sampling current signals at the sense signal lines using only the first candidate sampling frequency during each of the first time frames and using only the second sampling frequency during each of the second time frames.

2. The method of claim 1, wherein the step of changing the first sampling frequency to the first candidate sampling frequency comprises:
   iteratively adjusting the first sampling frequency by a predetermined amount to an adjusted frequency; and
   determining at each iteration if noise interferes with the adjusted frequency.

3. The method of claim 1, further comprising:
   after a period of time, changing the first candidate frequency back to the first frequency; and
   sampling current signals at the sense signal lines using only the first sampling frequency during each of the first time frames and using only the second sampling frequency during each of the second time frames.

4. The method of claim 1, further comprising:
detecting noise that interferes with the second sampling frequency;
while continuing to sample current signals at the sense signal lines using only the first candidate sampling frequency, changing the second sampling frequency to a second candidate sampling frequency that is not interfered with by the detected noise; and
sampling current signals at the sense signal lines using only the first sampling frequency during each of the first time frames and using only the second candidate sampling frequency during each of the second time frames.

5. The method of claim 1, further comprising:
controlling a clock switch with a microcontroller unit (MCU) to switch between the first and second sampling frequencies.

6. The method claim 1, further comprising:
controlling first and second voltage controllable oscillators to generate the first and second different sampling frequencies.

7. The method of claim 1, further comprising:
sampling current signals at the sense signal lines in first, second, and third successive time frames, wherein only the first sampling frequency is used to sample the current signals at the sense signal lines during each of the first time frames, only the second different sampling frequency is used to sample the current signals at the sense signal lines during each of the second time frames, and only a third different sampling frequency is used to sample the current signals at the sense signal lines during each of the third time frames.

8. The method of claim 1, wherein detecting noise that interferes with the first sampling frequency used in each of the first time frames comprises:
monitoring the signal-to-noise ratio of current signals received during the first time frames.

9. A touch device using multiple sampling frequencies, comprising:
a touch panel including a matrix of overlapping drive signal lines and sense signal line;
a control circuit, comprising:
a driver configured to drive the drive signal lines with voltage pulses that generate current signals at one or more of the sense signal lines in response to a touch input of a user at a point where the one or more sense signal lines overlap with one or more drive signal lines;
a receiver, configured to sample current signals at the plurality of sense signal lines;
a sampling frequency generation circuit, connected to the receiver, configured to generate first and second sampling frequencies for use by the receiver in alternating first and second successive time frames, respectively, wherein the second sampling frequency is different from the first sampling frequency; and
a microcontroller (MCU), configured to determine which of the first and second sampling frequencies is provided to the receiver for use in sampling the current signals at the plurality of sense signal lines,
wherein only the first sampling frequency is used by the receiver to sample the current signals at the sense signal lines during each of the first time frames and only the second sampling frequency is used by the receiver to sample the current signals at the sense signal lines during each of the second time frames, and
wherein the microcontroller is further configured to detect noise that interferes with the first sampling frequency, to cause the receiver to continue to sample the current signals at the sense signal lines using only the second sampling frequency while changing the first sampling frequency to a first candidate sampling frequency that is not interfered with by the detected noise, and to cause the receiver to sample current signals at the sense signal lines using only the first candidate sampling frequency during each of the first time frames and using only the second sampling frequency during each of the second time frames.

10. The touch device of claim 9, wherein the sampling frequency generation circuit comprises:
at least first and second voltage controllable oscillators configured to generate the first sampling frequencies, respectively; and
a clock switch, coupled between the receiver and each of the first and second voltage controllable oscillators, configured to control, in response to a control signal received from the MCU, which of the first and second sampling frequencies are provided to the receiver for use in sampling the current signals at the sense signal lines.

11. The touch device of claim 9, wherein to change the first sampling frequency to the first candidate sampling frequency the MCU is configured to iteratively adjust the first sampling frequency by a predetermined amount to an adjusted frequency, and to determine at each iteration if noise interferes with the adjusted frequency.

12. The touch device of claim 9, wherein the MCU is configured to, after a period of time, change the first candidate frequency back to the first frequency, and cause the receiver to sample the current signals at the sense signal lines using only the first sampling frequency during each of the first time frames and using only the second sampling frequency during each of the second time frames.

13. The touch device of claim 9, wherein the MCU is configured to detect noise that interferes with the second sampling frequency, to cause the receiver to continue to sample current signals using only the first candidate sampling frequency while changing the second sampling frequency to a second candidate sampling frequency that is not interfered with by the detected noise, and to cause the receiver to sample the current signals at the sense signal lines using only the first sampling frequency during each of the first time frames and using only the second candidate sampling frequency during each of the second time frames.

14. The touch device of claim 10, wherein the sampling frequency generation circuit comprises:
at least a third voltage controllable oscillator, configured to generate a third sampling frequency, wherein the clock switch is coupled between the receiver and each of the first, second, and third voltage controllable oscillators such that only the first sampling frequency is used to sample the current signals at the sense signal lines during each of the first time frames, only the second different sampling frequency is used to sample the current signals at the sense signal lines during each of the second time frames, and only a third different sampling frequency is used to sample the current signals at the sense signal lines during each of the third time frames.

* * * * *